US012699239B2

(12) United States Patent　　　　　(10) Patent No.:　US 12,699,239 B2

Winkler　　　　　　　　　　　　　　　(45) Date of Patent:　　　Aug. 4, 2026

(54) CIRCUIT ARRANGEMENT, SEMICONDUCTOR MODULE, ELECTRICAL SYSTEM, AND METHOD FOR OPTICALLY OUTPUTTING INFORMATION WITH THE AID OF A MOSFET

(71) Applicant: Robert Bosch GmbH, Stuttgart (DE)

(72) Inventor: Jonathan Winkler, Sonnenbuehl (DE)

(73) Assignee: ROBERT BOSCH GMBH, Stuttgart (DE)

( * ) Notice: Subject to any disclaimer, the term of this patent is extended or adjusted under 35 U.S.C. 154(b) by 269 days.

(21) Appl. No.: 18/568,459

(22) PCT Filed: Jul. 1, 2022

(86) PCT No.: PCT/EP2022/068243

§ 371 (c)(1),
(2) Date: Dec. 8, 2023

(87) PCT Pub. No.: WO2023/280700

PCT Pub. Date: Jan. 12, 2023

(65) Prior Publication Data

US 2024/0272391 A1　　　Aug. 15, 2024

(30) Foreign Application Priority Data

Jul. 7, 2021　(DE) ..................... 10 2021 207 131.7

(51) Int. Cl.
H04B 10/00　　　(2013.01)
G02B 6/42　　　(2006.01)
(Continued)

(52) U.S. Cl.
CPC ......... G02B 6/4293 (2013.01); G02B 6/4274 (2013.01); H10D 30/721 (2025.01); H10D 62/8325 (2025.01)

(58) Field of Classification Search
CPC .. G02B 6/4293; G02B 6/4274; H10D 30/721; H10D 62/8325; H03K 17/78; H04B 10/803; H04B 10/502
See application file for complete search history.

(56) References Cited

U.S. PATENT DOCUMENTS 5,072,439 A　*　12/1991　Forrest ................. H03K 17/693
　　　　　　　　　　　　　　　　　　398/55
7,880,126 B2 *　2/2011　Yonemaru .......... G01R 19/0061
　　　　　　　　　　　　　　　　　　327/333

(Continued)

FOREIGN PATENT DOCUMENTS

CN　　　111565489 A　　8/2020
DE　　102017212856 A1　　1/2019
(Continued)

OTHER PUBLICATIONS

International Search Report for PCT/EP2022/068243, Issued Nov. 16, 2022.

(Continued)

*Primary Examiner* — Agustin Bello

(74) *Attorney, Agent, or Firm* — NORTON ROSE FULBRIGHT US LLP

(57) ABSTRACT

A circuit arrangement, a semiconductor module, an electrical system, and a method for optically outputting information using a MOSFET. The circuit arrangement includes a MOSFET with an optical interface and a gate control circuit. The optical interface is configured to guide light, generated by an inverse diode of the MOSFET, into surroundings of the MOSFET. The gate control circuit is configured to receive an input signal representing information to be output using the circuit arrangement, and to generate from the input signal an output signal representing the information to be output. The gate control circuit varies the gate-source voltage of the MOSFET in a reverse mode of the MOSFET (Continued)

based on the output signal to vary a light emission of the inverse diode of the MOSFET in a corresponding manner, so that an output of the information to be output takes place via the optical interface of the MOSFET.

10 Claims, 1 Drawing Sheet

(51) Int. Cl.
H10D 30/69 (2025.01)
H10D 62/832 (2025.01)

(56) References Cited

U.S. PATENT DOCUMENTS

| | | | | |
|---|---|---|---|---|
| 9,247,591 | B2 | 1/2016 | Kang | |
| 9,595,958 | B1 * | 3/2017 | Nakano | H10D 84/811 |
| 10,236,986 | B1 * | 3/2019 | Shatz | H04B 10/516 |
| 10,879,878 | B1 * | 12/2020 | Hinnen | H02M 7/06 |
| 11,269,005 | B2 * | 3/2022 | Homoth | G01R 31/2656 |
| 2006/0197112 | A1 * | 9/2006 | Uchihara | H10F 55/00 |
| | | | | 257/213 |
| 2012/0280271 | A1 * | 11/2012 | Ichikawa | H10D 18/00 |
| | | | | 257/E29.217 |
| 2013/0069082 | A1 * | 3/2013 | Okada | H10D 84/146 |
| | | | | 257/77 |
| 2016/0071998 | A1 * | 3/2016 | Nakano | H10F 55/10 |
| | | | | 257/77 |
| 2017/0040992 | A1 * | 2/2017 | Nakano | H03K 17/20 |
| 2019/0198620 | A1 * | 6/2019 | Fujimoto | H10D 30/66 |
| 2019/0222211 | A1 * | 7/2019 | Yang | H05K 1/144 |
| 2020/0076513 | A1 * | 3/2020 | Imai | H04B 10/802 |
| 2020/0158777 | A1 * | 5/2020 | Homoth | G01R 31/2644 |
| 2020/0177092 | A1 * | 6/2020 | Ledezma | H02P 27/08 |
| 2020/0389168 | A1 * | 12/2020 | Lee | H03K 17/74 |
| 2020/0408829 | A1 * | 12/2020 | Ugur | G01R 31/2621 |
| 2021/0217688 | A1 * | 7/2021 | Sato | H01L 23/49517 |
| 2021/0396596 | A1 * | 12/2021 | Akin | G01K 7/00 |
| 2022/0393669 | A1 * | 12/2022 | Nojima | H03K 17/18 |
| 2023/0121426 | A1 * | 4/2023 | Aichinger | H10F 39/103 |
| | | | | 327/109 |
| 2024/0272391 | A1 * | 8/2024 | Winkler | H03K 17/78 |

FOREIGN PATENT DOCUMENTS

| | | |
|---|---|---|
| JP | H06151809 A | 5/1994 |
| JP | 2019087684 A | 6/2019 |

OTHER PUBLICATIONS

Xu, "On the Design and Optimization of Three-Terminal Light-Emitting Device in Silicon CMOS Technology," IEEE Journal of Selected Topics in Quantum Electronics, IEEE, vol. 20, No. 4, 2012, pp. 1-8.

Li et al., "Efficient Optical Modulator by Reverse-Biased III-V/SI Hybrid MOS Capacitor Based on FK Effect and Carrier Depletion," 2019 Optical Fiber Communications Conference and Exhibition (OFC), 2019, pp. 1-3.

Pala et al., "Physics of Bipolar, Unipolar and Intermediate Conduction Modes in Silicon Carbide MOSFET Body Diodes," Proceedings of the 2016 28th International Symposium on Power Semiconductor Devices and ICS (ISPSD), 2016, pp. 227-230. <https://sci-hub.ru/10.1109/ispsd.2016.7520819> Downloaded Oct. 17, 2023.

Dolny et al., "The Influence of Body Effect and Threshold Voltage Reduction on Trench MOSFET Body Diode Characteristics," Proceedings of 2004 International Symposium on Power Semiconductor Devices and ICS, 2044, pp. 217-220. <https://sci-hub.ru/10.1109/wct.2004.239935> Downloaded Oct. 17, 2023.

* cited by examiner

CIRCUIT ARRANGEMENT, SEMICONDUCTOR MODULE, ELECTRICAL SYSTEM, AND METHOD FOR OPTICALLY OUTPUTTING INFORMATION WITH THE AID OF A MOSFET

FIELD

The present invention relates to a circuit arrangement, a semiconductor module, an electrical system, and a method for optically outputting information with the aid of a MOSFET.

BACKGROUND INFORMATION

Silicon carbide (SiC) MOSFETs from the related art which, in contrast to typical silicon (Si) MOSFETs, have a strong dependency with regard to an applied gate-source voltage in a passive reverse mode. A resulting effect is also referred to as a "body effect," and is known primarily in conjunction with Si-based MOSFETs in integrated circuits.

In addition, an inverse diode (body diode) of a MOSFET, which has an effect when a substrate of the MOSFET is electrically connected to a source terminal of the MOSFET, becomes conductive when a potential between the drain and the source is inverted. This effectuates a current- and temperature-dependent light emission through this inverse diode.

German Patent Application No. DE 10 2017 212 856 A1 describes a device for converting electrical energy, and a method for determining the temperature of a semiconductor element via luminescence.

"Physics of bipolar, unipolar and intermediate conduction modes in Silicon Carbide MOSFET body diodes," V. Pala et al., 2016, 28th International Symposium on Power Semiconductor Devices and ICs (ISPSD), describes the physics of SiC MOSFETs in third quadrant operation, and the influences of a change in threshold voltage due to the body effect and the voltage drop across the anode junction.

"The influence of body effect and threshold voltage reduction on trench MOSFET body diode characteristics," Dolny et al., 2004 Proceedings of the 16th International Symposium on Power Semiconductor Devices and ICs, describes the inverse diode characteristic of high-channel density trench power MOSFETs.

SUMMARY

According to a first aspect of the present invention, a circuit arrangement for optically outputting information using a MOSFET is provided. The circuit arrangement includes a MOSFET with an optical interface and a gate control circuit.

According to an example embodiment of the present invention, the optical interface of the MOSFET is configured to guide light, generated by an inverse diode (also referred to as "body diode") of the MOSFET, into the surroundings of the MOSFET. For this purpose, for example a through hole is provided in a housing of the MOSFET, and/or an optical fiber and/or some other light-guiding device such as a transmissive window is provided in the area of the inverse diode.

The gate control circuit is, for example, a discrete and/or integrated analog and/or digital circuit that is designed, for example, as an ASIC, FPGA, processor, digital signal processor, microcontroller, or the like. In addition, it is possible for the gate control circuit to be an integral part of a gate driver circuit of the MOSFET which is used to set one or multiple operating points of the MOSFET (for example, with the aid of one or multiple predefined direct voltages). Alternatively or additionally, the gate control circuit is designed as a circuit that is separate from the gate driver circuit.

According to an example embodiment of the present invention, the gate control circuit is configured to receive an input signal that represents information, which in principle may be any type of information, to be output with the aid of the circuit arrangement. In addition, the gate control circuit is configured to generate from the input signal an output signal which likewise represents the information to be output and which is additionally suitable for varying a gate-source voltage of the MOSFET in a reverse mode of the MOSFET. The reverse mode is achieved by a drain-source voltage of the MOSFET of less than 0 V, which may be brought about by external wiring of the MOSFET, for example via an inductive load.

As a function of a particular characteristic of the input signal and particular application-specific requirements for the output signal, it is possible for the output signal and the input signal to be identical, or for the output signal and the input signal to have a linear or a nonlinear relationship with one another. In addition, arbitrary transformations of the input signal are in principle usable for generating the output signal, as long as the information to be output is reconstructable from the output signal.

According to an example embodiment of the present invention, the gate control circuit is also configured to vary a gate-source voltage of the MOSFET in a reverse mode of the MOSFET, based on the output signal, in order to vary a light emission of the inverse diode of the MOSFET in a corresponding manner, as a result of which an output of the information to be output takes place via the optical interface of the MOSFET.

It is pointed out that the variation of the gate-source voltage of the MOSFET, brought about by the output signal, in principle is not limited to certain voltage variations of the gate-source voltage. As a function of a type of MOSFET used and/or of a characteristic of the output signal and/or of a necessary magnitude of a light emission to be generated by the inverse diode, on the one hand it is possible for the gate-source voltage to be varied solely in the negative voltage range. On the other hand, it is also possible to vary the gate-source voltage by varying the gate-source voltage between negative voltage values and 0 V, and/or between 0 V and positive voltage values (for example, up to the threshold voltage of the MOSFET or beyond), and/or between negative voltage values and positive voltage values.

The circuit arrangement according to the present invention provides the advantage, among others, that the light emission made possible with the aid of the reverse mode is usable for an output of information that is not generated by the MOSFET itself. The latter pertains in particular to internal influences of the light emission of the inverse diode due to changes in the temperature of the MOSFET barrier layer. With a suitable design of the output signal, such MOSFET-internal influences on the light emission of the inverse diode may be reliably separated from the influences according to the present invention of the light emission of the inverse diode.

One particular advantage of the circuit arrangement according to the present invention also results due to the fact that the information output provided here allows galvanic insulation on an optical basis between the circuit arrangement and a component that receives the light emission or the information to be output.

Preferred refinements of the present invention are disclosed herein.

According to an example embodiment of the present invention, the MOSFET is preferably a silicon (Si) MOSFET or a silicon carbide (SiC) MOSFET, without thus limiting the MOSFET to the above variants. In the context of the present invention, SiC MOSFETs are particularly advantageously usable, since a particularly high light emission is generatable by same with the aid of the inverse diode. Possible examples of operating point ranges for a SiC MOSFET in the context of the present invention are between −1 V and −8 V, preferably between −2 V and −6 V, and particularly preferably in the range of −4 V, without thus being limited to these voltage ranges.

The information to be output is preferably information that is generated by the gate control circuit itself and/or by a component (for example, a separate gate driver, etc.) that is connected to the gate control circuit using information technology. The information to be output is particularly advantageously information that is generated by a sensor (for example, a temperature sensor and/or a current sensor, etc.).

In one advantageous embodiment of the present invention, the output signal represents an amplitude modulation and/or a frequency modulation and/or a phase modulation and/or a pulse width modulation of the input signal. This is advantageously usable, among other cases, when the information to be transferred is present in a similar frequency range as above-described influences on the light emission by the MOSFET itself.

By modulating the information to be output with a carrier signal that has a higher frequency compared to such a frequency range, a filter option for distinguishing the light emission components that are brought about by the information to be output from the light emission components that are brought about by internal influences of the MOSFET is provided in a receiver component for the light emission. For example, high-pass filtering that is designed with respect to the modulated output signal is used for this purpose. In addition, the provided modulation is also advantageously usable for improving a signal-to-noise ratio of the information to be output.

Furthermore, it is advantageously possible for the varying of the gate-source voltage based on the output signal to effectuate an asymmetrical variation of the gate-source voltage around an operating point of the MOSFET that is being used at the time. This allows, for example, a compensation for an influence of a nonlinear characteristic curve in the range of the operating point of the MOSFET and/or of the inverse diode, with the objective that essentially identical positive and negative signal amplitudes of the input signal result essentially in an increase or decrease of a light emission by the inverse diode that are identical according to amount. Alternatively or additionally, it is also possible for the varying of the gate-source voltage to effectuate an alternating switchover between a light-emitting state and a nonlight-emitting state of the inverse diode of the MOSFET. This allows, among other things, a particularly reliable distinction between the two signal states in a receiver component for the light emission. For the example of a SiC MOSFET, it is possible for the information that is to be output to be provided, for example, by a switchover, corresponding to the first signal, of the operating point of the MOSFET between −4 V (i.e., the inverse diode is in a light-emitting state) and +18 V (i.e., the inverse diode is in a state in which it emits no light), without thus being limited to these specific voltage values. In addition, it is also possible to switch over in this way between three or more different operating points, for example to achieve a ternary or higher-order signal transfer.

According to a second aspect of the present invention, a semiconductor module, in particular a power module, is provided which includes a circuit arrangement according to the above description, the optical interface of the MOSFET being optically coupled to a receiver component of the semiconductor module (for example, a photodiode situated in the semiconductor module for utilizing the information, to be output, within the semiconductor module itself), and/or the semiconductor module including an optical module interface that is optically coupled to the optical interface of the MOSFET. The latter case allows a utilization of the information, to be output, outside the semiconductor module, in that the semiconductor module guides the light emissions of the inverse diode of the MOSFET via an optical interface (for example, a through hole and/or an optical window and/or an optical fiber interface, etc.) into the surroundings of the semiconductor module. It is pointed out that the semiconductor module in principle may include an arbitrary number of further components (for example, further MOSFETs, or components different from same). It is evident that the features, feature combinations, and the advantages resulting therefrom correspond to those stated in conjunction with the first-mentioned aspect of the present invention, so that reference is made to the above statements in order to avoid repetitions.

According to a third aspect of the present invention, an electrical system is provided that includes a circuit arrangement and/or a semiconductor module according to the above description. The electrical system is configured to place the MOSFET, at least temporarily, in particular repeatedly, in a reverse mode. As described above, such a reverse mode results, for example, in conjunction with an inductive load that is switched by the MOSFET or by a plurality of MOSFETs, and/or results from a different cause for a reverse of potential of the drain-source voltage of the MOSFET. The reverse mode of the MOSFET is preferably automatically recognized by the circuit arrangement, so that an output of the information to be output takes place in a targeted manner only in particular phases of the reverse mode. In this regard, it is also possible, as a function of a possible need to transfer information to be output, which is present at the time, to the outside with a maximum allowable time delay with the aid of the inverse diode, for an establishment of the reverse mode, induced thereby, to take place with the aid of the circuit arrangement and/or a further component of the electrical system. This may be relevant in particular when function-relevant and/or safety-critical data (for example, for avoiding overheating of a semiconductor module, etc.) are output with the aid of the information to be output. It is evident that the features, feature combinations, and the advantages resulting therefrom correspond to those stated in conjunction with the first- and second-mentioned aspects of the present invention, so that reference is made to the above statements in order to avoid repetitions.

According to an example embodiment of the present invention, the electrical system preferably additionally includes a light detector (for example, a photodiode, a silicon photomultiplier, etc.), the light detector being optically coupled to the optical interface of the MOSFET and/or to the optical module interface of the semiconductor module, and being configured to receive light that is emitted by the inverse diode of the MOSFET, to generate a measuring signal from the received light, and to provide the measuring signal to the electrical system. In the case that the output signal represents a modulated representation of the input signal, the measuring signal is for example initially supplied to a demodulator of the electrical system in order to demodulate the output light signal prior to further use. In addition, arbitrary further parts and/or components and/or modules of the electrical system are suitable as receivers of the measuring signal of the light detector.

The electrical system is, for example, a bridge circuit (for example, a half bridge, a full bridge, etc.) and/or a drive converter and/or a DC/DC voltage converter and/or an AC/AC voltage converter and/or an inverter and/or a rectifier and/or a switch mode power supply and/or an electrical system of a vehicle.

According to a fourth aspect of the present invention, a method for optically outputting information with the aid of a MOSFET of a circuit arrangement is provided. In a first step of the method according to the present invention, an input signal that represents information to be output with the aid of the circuit arrangement is received by a gate control circuit of the MOSFET of the circuit arrangement. In a second step of the method according to the present invention, an output signal is generated from the input signal, the output signal likewise representing the information to be output and additionally being suited for varying a gate-source voltage of the MOSFET in a reverse mode of the MOSFET. In a third step of the method according to the present invention, the gate-source voltage of the MOSFET is varied in a reverse mode of the MOSFET, based on the output signal, in order to vary a light emission of an inverse diode of the MOSFET in a corresponding manner, as a result of which an output of the information to be output takes place via an optical interface of the MOSFET. It is evident that the features, feature combinations, and the advantages resulting therefrom correspond to those stated in conjunction with the first-, second-, and third-mentioned aspects of the present invention, so that reference is made to the above statements in order to avoid repetitions.

BRIEF DESCRIPTION OF THE DRAWINGS

Exemplary embodiments of the present invention are described in greater detail below with reference to the figures.

DETAILED DESCRIPTION OF EXAMPLE EMBODIMENTS

Figure 1:
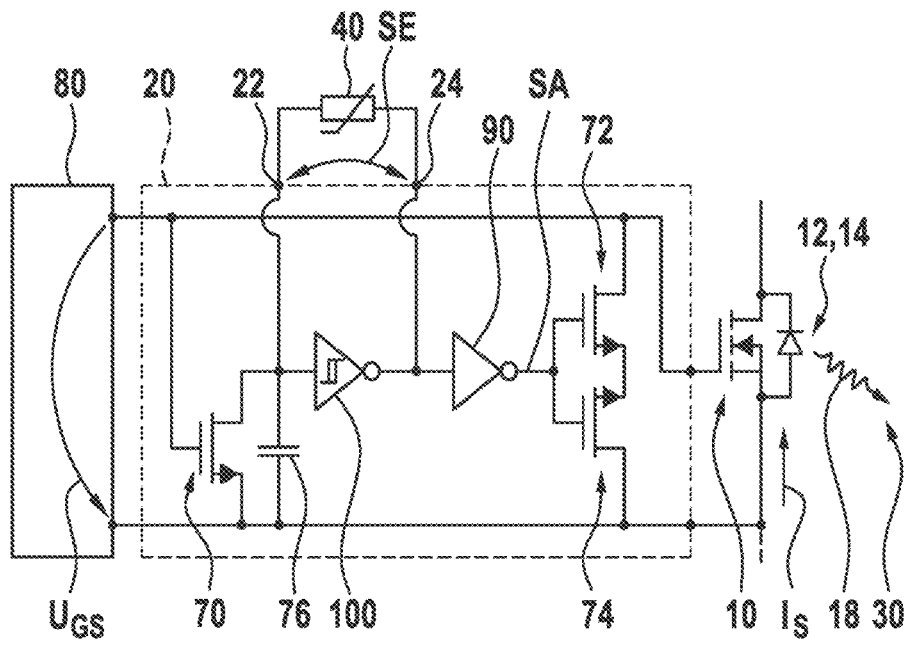
FIG. 1 shows a circuit diagram of one specific example embodiment of a circuit arrangement according to the present invention.

FIG. 1 shows a circuit diagram of one specific embodiment of a circuit arrangement according to the present invention. The circuit arrangement includes a gate driver 80, a gate control circuit 20, and a first MOSFET 10 with an optical interface 12, which in the present case is designed as a SiC MOSFET.

The gate driver provides a gate-source voltage $U_{GS}$ which Substitute Specification establishes an operating point of first MOSFET 10.

Gate control circuit 20 includes a first terminal 22 and a second terminal 24 via which gate control circuit 20 is configured to receive an input signal SE that represents information to be output with the aid of the circuit arrangement. Input signal SE is determined here by a temperature-dependent resistor 40 that is configured to detect an ambient temperature of the circuit arrangement.

Gate control circuit 20 also includes an oscillator whose output frequency corresponds to the temperature of temperature-dependent resistor 40, and which is configured to generate an output signal SA that corresponds to a frequency modulation of input signal SE. The oscillator uses a Schmitt trigger 100 and an oscillator capacitor 76, oscillator capacitor 76 being charged or discharged by an inverted output of Schmitt trigger 100 via temperature-dependent resistor 40.

The output of the oscillator controls a discharging circuit made up of a third MOSFET 72 (n-channel MOSFET), and a fourth MOSFET 74 (n-channel MOSFET) which is configured to short-circuit the gate of first MOSFET 10 with regard to a source terminal of first MOSFET 10 in order to vary a negative block voltage of MOSFET 10 that is applied by gate driver 80. Third MOSFET 72 and fourth MOSFET 74 are arranged in a so-called "back-to-back" configuration in which their respective inverse diodes (not shown) are connected in anti-series to prevent a reverse current. An amplitude of the discharge is established, taking into account a gate capacitance of first MOSFET 10 and a desired oscillator frequency of the oscillator. If gate-source voltage $U_{GS}$ is positive, capacitor 76 is short-circuited by a second MOSFET 70 (n-channel MOSFET) of the circuit arrangement, as a result of which the oscillator is deactivated. The oscillator is thus active only when the block voltage is present at first MOSFET 10.

An inverter 90 is provided to make third MOSFET 72 and fourth MOSFET 74 inactive. If a current Is flows through inverse diode 14 of first MOSFET 10, due to the frequency modulation of gate-source voltage $U_{GS}$ the temperature signal of temperature-dependent resistor 40 is modulated to light emission 18 of inverse diode 14, and may be detected in a galvanically insulated manner, for example with the aid of a demodulator (not shown) situated in the surroundings 30 of first MOSFET 10.

Since the information to be output is transferred via the variation in the frequency here, an influence of the temperature of first MOSFET 10 or of exciting current Is does not have an adverse effect on the absolute intensity of light emission 18, thus enabling a robust transfer of the information to be output.

Figure 2:
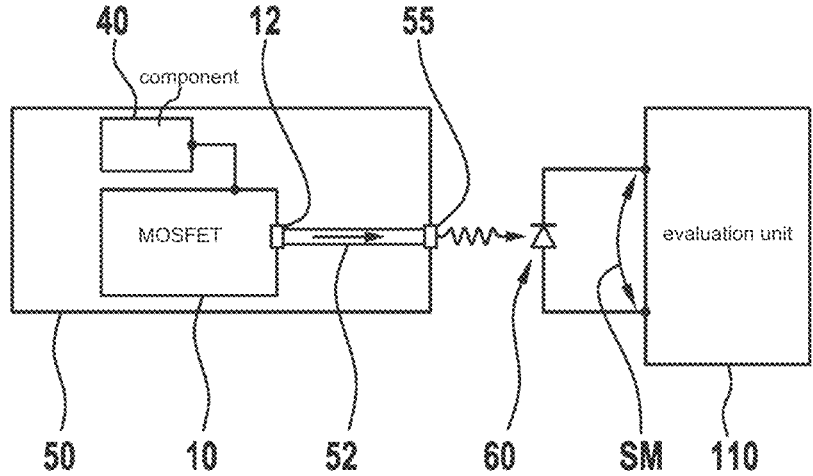
FIG. 2 shows a schematic overview of one specific embodiment of an electrical system according to the present invention.

FIG. 2 shows a schematic overview of one specific embodiment of an electrical system according to the present invention, which in the present case represents a part of an electrical system of a vehicle. The electrical system includes a semiconductor module 50 that contains a circuit arrangement (not shown) according to the present invention for activating a MOSFET 10 based on an input signal SE, which is generated by a component 40 of semiconductor module 50 and represents information to be output.

MOSFET 10, which is a SiC MOSFET here, includes an optical interface 12 that is designed in such a way that a light emission 18 of an inverse diode 14 (not shown) of MOSFET 10 is guided via optical interface 12 to an outer side of MOSFET 10.

Optical interface 12 is optically coupled to an optical fiber 52 which guides light emitted by inverse diode 14 to an optical module interface 55 of semiconductor module 50. The light emitted by inverse diode 14 is radiated via optical module interface 55 in the direction of a photodiode 60 of the electrical system, which is configured to convert the emitted light into a measuring signal SM and provide it to an evaluation unit 110 of the electrical system.

What is claimed is:

1. A circuit arrangement for optically outputting information using a MOSFET, comprising:

a MOSFET that includes an optical interface; and a gate control circuit;

wherein the optical interface of the MOSFET is configured to guide light, generated by an inverse diode of the MOSFET, into surroundings of the MOSFET; and wherein the gate control circuit is configured to:

receive an input signal which represents information to be output using the circuit arrangement, generate from the input signal an output signal which represents the information to be output and which is additionally suitable for varying a gate-source voltage of the MOSFET in a reverse mode of the MOSFET, and vary the gate-source voltage of the MOSFET in the reverse mode of the MOSFET based on the output signal to vary a light emission of the inverse diode of the MOSFET in a corresponding manner, as a result of which an output of the information to be output takes place via the optical interface of the MOSFET.

2. The circuit arrangement as recited in claim 1, wherein the MOSFET is: (i) a Si MOSFET, or (ii) a SiC MOSFET.

3. The circuit arrangement as recited in claim 1, wherein the information to be output is information that is generated by:

the gate control circuit, and/or a component that is connected to the gate control circuit using information technology;

wherein the information is generated by a sensor.

4. The circuit arrangement as recited in claim 1, wherein the output signal represents:

an amplitude modulation of the input signal, and/or a frequency modulation of the input signal, and/or a phase modulation of the input signal, and/or a pulse width modulation of the input signal.

5. The circuit arrangement as recited in claim 1, wherein the varying of the gate-source voltage based on the output signal effectuates:

an asymmetrical variation of the gate-source voltage around an operating point of the MOSFET, and/or an alternating switchover between a light-emitting state and a nonlight-emitting state of the inverse diode of the MOSFET.

6. A semiconductor module, comprising:

a circuit arrangement for optically outputting information using a MOSFET, including:

a MOSFET that includes an optical interface; and a gate control circuit;

wherein the optical interface of the MOSFET is configured to guide light, generated by an inverse diode of the MOSFET, into surroundings of the MOSFET; and wherein the gate control circuit is configured to:

receive an input signal which represents information to be output using the circuit arrangement, generate from the input signal an output signal which represents the information to be output and which is additionally suitable for varying a gate-source voltage of the MOSFET in a reverse mode of the MOSFET, and vary the gate-source voltage of the MOSFET in the reverse mode of the MOSFET based on the output signal to vary a light emission of the inverse diode of the MOSFET in a corresponding manner, as a result of which an output of the information to be output takes place via the optical interface of the MOSFET, wherein the optical interface of the MOSFET is optically coupled to a receiver component of the semiconductor module, and/or the semiconductor module includes an optical module interface that is optically coupled to the optical interface of the MOSFET.

7. An electrical system, comprising:

(i) a circuit arrangement for optically outputting information using a MOSFET, including:

a MOSFET that includes an optical interface; and a gate control circuit;

wherein the optical interface of the MOSFET is configured to guide light, generated by an inverse diode of the MOSFET, into surroundings of the MOSFET; and wherein the gate control circuit is configured to:

receive an input signal which represents information to be output using the circuit arrangement, generate from the input signal an output signal which represents the information to be output and which is additionally suitable for varying a gate-source voltage of the MOSFET in a reverse mode of the MOSFET, and vary the gate-source voltage of the MOSFET in the reverse mode of the MOSFET based on the output signal to vary a light emission of the inverse diode of the MOSFET in a corresponding manner, as a result of which an output of the information to be output takes place via the optical interface of the MOSFET; and/or (ii) a semiconductor module including the circuit arrangement, wherein the optical interface of the MOSFET is optically coupled to a receiver component of the semiconductor module, and/or the semiconductor module includes an optical module interface that is optically coupled to the optical interface of the MOSFET;

wherein the electrical system is configured to place the MOSFET, at least temporarily, repeatedly, in a reverse mode.

8. The electrical system as recited in claim 7, further comprising a light detector, wherein the light detector is:

optically coupled to the optical interface of the MOSFET and/or to the optical module interface of the semiconductor module, and configured to receive light that is emitted by the inverse diode of the MOSFET, generate a measuring signal from the received light, and provide the measuring signal to the electrical system.

9. The electrical system as recited in claim 7, wherein the electrical system is a bridge circuit, and/or a drive converter, and/or a DC/DC voltage converter, and/or an AC/AC voltage converter, and/or an inverter, and/or a rectifier, and/or a switch mode power supply, and/or an electrical system of a vehicle.

10. A method for optically outputting information using a MOSFET of a circuit arrangement, the method comprising the following steps:

receiving an input signal, which represents information to be output using the circuit arrangement, by a gate control circuit of the MOSFET of the circuit arrangement;

generating an output signal from the input signal, the output signal representing the information to be output and being additionally suitable for varying a gate-source voltage of the MOSFET in a reverse mode of the MOSFET; and varying the gate-source voltage of the MOSFET in the reverse mode of the MOSFET based on the output signal to vary a light emission of the inverse diode of the MOSFET in a corresponding manner, as a result of which an output of the information to be output takes place via an optical interface of the MOSFET.

\* \* \* \* \*